US010411572B2

(12) United States Patent
Ninomiya et al.

(10) Patent No.: US 10,411,572 B2
(45) Date of Patent: Sep. 10, 2019

(54) VEHICLE-USE ALTERNATING CURRENT GENERATOR REGULATOR

(71) Applicant: Mitsubishi Electric Corporation, Tokyo (JP)

(72) Inventors: Kenta Ninomiya, Tokyo (JP); Kazunori Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 114 days.

(21) Appl. No.: 15/544,926

(22) PCT Filed: Jun. 5, 2015

(86) PCT No.: PCT/JP2015/066319
§ 371 (c)(1),
(2) Date: Jul. 20, 2017

(87) PCT Pub. No.: WO2016/194220
PCT Pub. Date: Dec. 8, 2016

(65) Prior Publication Data
US 2018/0006540 A1    Jan. 4, 2018

(51) Int. Cl.
*H02K 11/00*  (2016.01)
*H02K 19/24*  (2006.01)
(Continued)

(52) U.S. Cl.
CPC .............. *H02K 19/24* (2013.01); *H02K 5/225* (2013.01); *H02K 11/0094* (2013.01);
(Continued)

(58) Field of Classification Search
CPC ........ H02K 11/00; H02K 11/04; H02K 19/36; H02K 5/22; H02K 19/24; H02K 19/365;
(Continued)

(56) References Cited

U.S. PATENT DOCUMENTS 4,742,263 A * 5/1988 Harnden, Jr. ......... H01L 41/094
200/181
5,176,140 A * 1/1993 Kami ....................... A61B 8/12
310/327

(Continued)

FOREIGN PATENT DOCUMENTS

CN    102630364 A    8/2012
JP    60-100462 A    6/1985
(Continued)

OTHER PUBLICATIONS

Communication dated Jul. 10, 2018 issued by the Japanese Patent Office in counterpart application No. 2017-521468.
(Continued)

*Primary Examiner* — Naishadh N Desai
(74) *Attorney, Agent, or Firm* — Sughrue Mion, PLLC; Richard C. Turner

(57) ABSTRACT

A vehicle-use alternating current generator regulator includes an IC regulator wherein an IC chip is sealed with resin and a lead terminal for external connection protrudes from a sealing resin, and a regulator holder having a lead opposing portion that encloses an IC regulator mounting portion in which the IC regulator is mounted. A configuration is such that the lead terminal has a lead protruding portion protruding from a contact with the regulator holder, and the IC regulator is positioned by the lead protruding portion being fitted into the lead opposing portion of the regulator holder.

6 Claims, 11 Drawing Sheets

(51) Int. Cl.
  *H02K 5/22* (2006.01)
  *H02K 11/04* (2016.01)
  *H02K 19/36* (2006.01)
  *H01L 23/498* (2006.01)
  *H02K 5/14* (2006.01)

(52) U.S. Cl.
  CPC ......... *H02K 11/046* (2013.01); *H02K 19/365* (2013.01); *H01L 23/49833* (2013.01); *H02K 5/141* (2013.01)

(58) Field of Classification Search
  CPC .. H02K 11/0094; H02K 11/046; H02K 5/225; H02K 5/141; H01L 23/49833
  USPC .......................................................... 310/71
  See application file for complete search history.

(56) References Cited

U.S. PATENT DOCUMENTS

| | | | |
|---|---|---|---|
| 2002/0024324 A1* | 2/2002 | Yamamoto | H02K 19/36 322/28 |
| 2004/0155540 A1* | 8/2004 | Nakamura | H02K 5/225 310/68 D |
| 2008/0296796 A1 | 12/2008 | Watanabe et al. | |
| 2011/0034779 A1 | 2/2011 | Loftus et al. | |
| 2011/0034780 A1 | 2/2011 | Loftus et al. | |
| 2011/0034781 A1 | 2/2011 | Loftus et al. | |
| 2011/0148366 A1 | 6/2011 | Iwamoto et al. | |
| 2012/0165613 A1 | 6/2012 | Loftus et al. | |
| 2012/0172669 A1 | 7/2012 | Loftus et al. | |
| 2012/0190935 A1 | 7/2012 | Loftus et al. | |
| 2012/0197300 A1 | 8/2012 | Loftus et al. | |
| 2012/0200204 A1* | 8/2012 | Kimata | H02K 19/365 310/68 C |
| 2014/0022729 A1* | 1/2014 | Di Risio | H02K 11/024 361/704 |
| 2015/0076661 A1* | 3/2015 | Musk | H01L 23/4985 257/615 |

FOREIGN PATENT DOCUMENTS

| | | |
|---|---|---|
| JP | 3-148165 A | 6/1991 |
| JP | 05-102380 A | 4/1993 |
| JP | 11-97610 A | 4/1999 |
| WO | 2011/016852 A1 | 2/2011 |
| WO | 2011/061852 A1 | 5/2011 |

OTHER PUBLICATIONS

Communication dated Dec. 10, 2018, from European Patent Office in counterpart application No. 15894253.2.
International Search Report for PCT/JP2015/066319, dated Aug. 11, 2015.
Communication dated Jan. 14, 2019 from the Intellectual Property Office of the P.R.C. in application No. 201580080454.7.
Communication dated Apr. 8, 2019 from the European Patent Office in application No. 15894253.2.
Communication dated Jul. 22, 2019, from the European Patent Office in counterpart European Application No. 15 894 253.2.

* cited by examiner

VEHICLE-USE ALTERNATING CURRENT GENERATOR REGULATOR

This application is a National Stage of International Application No. PCT/JP2015/066319 filed Jun. 5, 2015, the contents of all of which are incorporated herein by reference in their entirety.

TECHNICAL FIELD

The present invention relates to a regulator of a vehicle-use alternating current generator in which a molded package type IC regulator is mounted.

BACKGROUND ART

A regulator, which is a voltage control device of a vehicle-use alternating current generator, has a function of regulating an output voltage of the generator by controlling a turning on and off of a field current caused to flow into a field winding.

Further, in recent years, a regulator having, in addition to the voltage control function, a function of communicating with a device mounted in an external vehicle, a function of preventing a sharp rise in generator drive torque by restricting the steepness of an increase in output current when increasing an electrical load, and the like, is also being used.

Also, a regulator voltage control circuit being principally one that has been formed into an IC chip, employment of, for example, a molded package type IC regulator wherein a multiple of connection terminals of the voltage control circuit and an external circuit are formed integrally is also spreading (for example, refer to Patent Document 1).

A molded package type IC regulator is mounted in a regulator holder with which an insert terminal is integrally molded, and which is joined to a connection terminal of the IC regulator. At this time, it is necessary to adjust the positions of the connection terminals in order to increase reliability of the junction of the IC regulator and regulator holder. In Patent Document 1, a force fitting type fitting structure is provided in mounting faces of a package outer periphery and the regulator holder, and the like, whereby positioning of the IC regulator and regulator holder is carried out. Also, Patent Document 1 shows technology such that planar rotational deviation is prevented by providing a depression and projecting portion, which provide an advantage when positioning, in two or more places.

Meanwhile, demands from vehicle makers for cost reductions are intensifying, and together with reducing device size, reducing procurement costs by employing general-purpose parts is also being considered. In the case of a regulator, there is a trend for simplifying procurement in various regions, reducing quality control costs, and the like, to be promoted by, for example, employing an industrial standard external package form "TO220".

CITATION LIST

Patent Literature

Patent Document 1: International Unexamined Patent Application No. 2011/061852 A1

SUMMARY OF INVENTION

Technical Problem

Connection terminals installed in an IC regulator and IC regulator mounting portion both have a small terminal width, and when positional deviation occurs, there is concern that a junction area cannot be secured and that junction failure will occur. Not only terminal width but also an interval between neighboring terminals is small, because of which there is also concern that positional deviation when mounting the IC regulator on the IC regulator mounting portion will cause an unintended electrical connection, and a problem occurs in reliability as a generator.

Also, providing a fixing portion formed of depressions or projecting portions in two or more places in an IC regulator attachment flat portion to correspond to a mounting face is possible when a package main body is large. However, when forming a fixing portion on a comparatively small package, there is a problem in that the ratio of the amount of the package occupied by the fixing portion increases, and it is difficult to provide the fixing portion in a multiple of places.

Also, there is a case in which the IC regulator is a general-purpose item, and dimensional accuracy of an outer periphery of a molded resin portion is not high. Because of this, when providing a fitting portion in the outer periphery of the IC regulator and fitting the IC regulator in a holder, there is a problem in that it is difficult to obtain a product (general-purpose IC regulator) with assembly accuracy sufficient for fitting the resins of the IC regulator and regulator holder.

As a result, there is concern about not being able to meet needs with respect to a small package, and not being able to win in competition in selling to vehicle makers.

Furthermore, as a problem with general-purpose parts provided from semiconductor makers, the heretofore described general-purpose package is in accordance with individual maker settings, such as a mold cracking standard of a molded portion of the package, because of which it is difficult to respond to all states when taking delivery from various companies and forming an assembled product, and the reality is that positional deviation, insufficient accuracy, and the like, occur easily.

The invention, having been contrived in order to resolve the heretofore described kinds of problem, has an object of providing a vehicle-use alternating current generator regulator such that positioning accuracy can be improved when mounting the IC regulator in a regulator holder, a general-purpose IC regulator can be used, there is no large change in a design of an IC regulator mounting portion of the regulator holder, and productivity can also be improved.

Solution to Problem

A vehicle-use alternating current generator regulator according to the invention includes an IC regulator wherein an IC chip that configures a voltage control circuit of the vehicle-use alternating current generator is sealed with resin, and a lead terminal for external connection protrudes from a sealing resin, and a regulator holder having an IC regulator mounting portion in which the IC regulator is mounted and a lead opposing portion, provided on a periphery of the IC regulator mounting portion, opposing the lead terminal, wherein the lead terminal has a lead protruding portion protruding from a contact with the regulator holder, and the IC regulator is positioned by the lead protruding portion being fitted into the lead opposing portion of the regulator holder.

Advantageous Effects of Invention

According to the vehicle-use alternating current generator regulator of the invention, an IC regulator can be positioned in a lead opposing portion of a regulator holder with high accuracy, with no accompanying large change in design of the IC regulator and an IC regulator mounting portion, and without increasing the size of an external form of the regulator holder. Also, an improvement in the reliability of assembling the IC regulator, and in productivity, can be achieved, and a general-purpose IC regulator can be employed, whereby cost can be kept low.

The foregoing and other objects, features, aspects and advantages of the present invention will become more apparent from the following detailed description of the present invention when taken in conjunction with the accompanying drawings.

BRIEF DESCRIPTION OF DRAWINGS

FIGS. 5A and 5B are diagrams of an IC regulator according to the first embodiment of the invention, wherein FIG. 5A is a plan view and side view of when mounting in the regulator holder, and FIG. 5B is a plan view of when procuring a part.

FIGS. 6A and 6B are main portion plan views showing fitting portions of the IC regulator and regulator holder of the regulator according to the first embodiment of the invention, wherein FIG. 6A is a diagram showing the regulator holder in a state in which the IC regulator is not housed, and FIG. 6B is a diagram of a state in which the IC regulator is housed in the regulator holder.

FIGS. 11A and 11B are plan views of a regulator according to a third embodiment of the invention, wherein FIG. 11A is a type of regulator including a brush and a main portion enlarged view, and FIG. 11B is a diagram showing a type of regulator that does not include a brush.

DESCRIPTION OF EMBODIMENTS

First Embodiment

Figure 1:
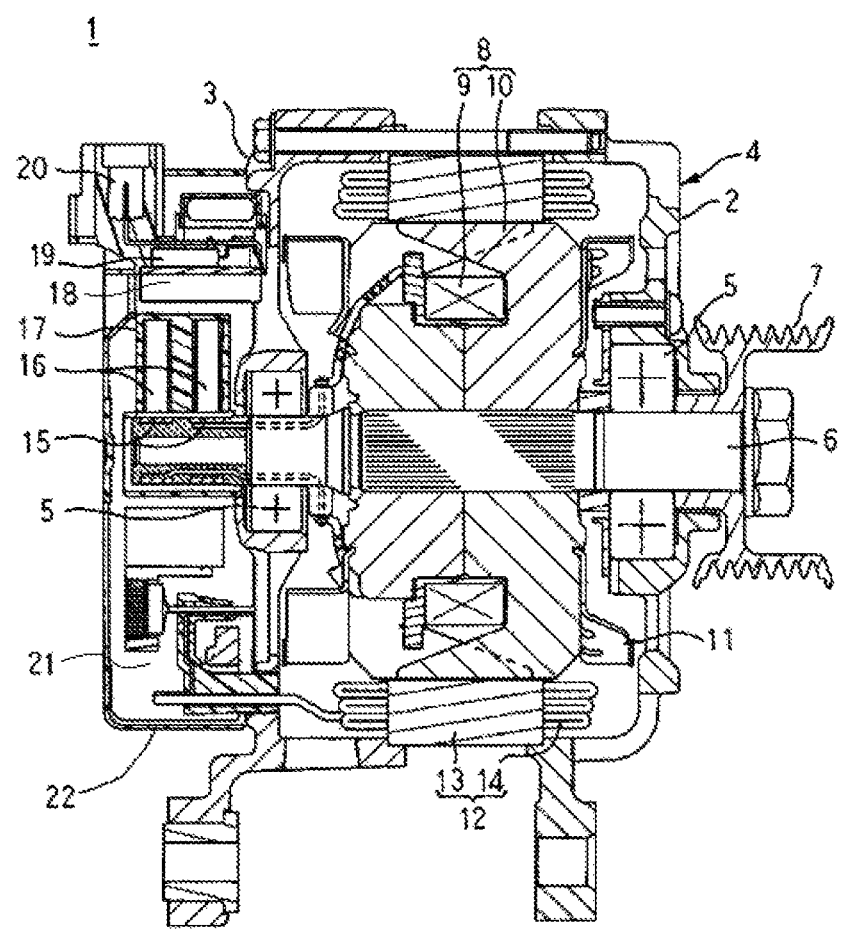
FIG. 1 is a schematic sectional view showing an overall structure of a vehicle-use alternating current generator in which is mounted a regulator according to a first embodiment of the invention.

Hereafter, embodiments of the invention will be described, with reference to FIG. 1 to FIG. 9D. Identical reference signs in the drawings indicate identical or corresponding portions.

Figure 2:
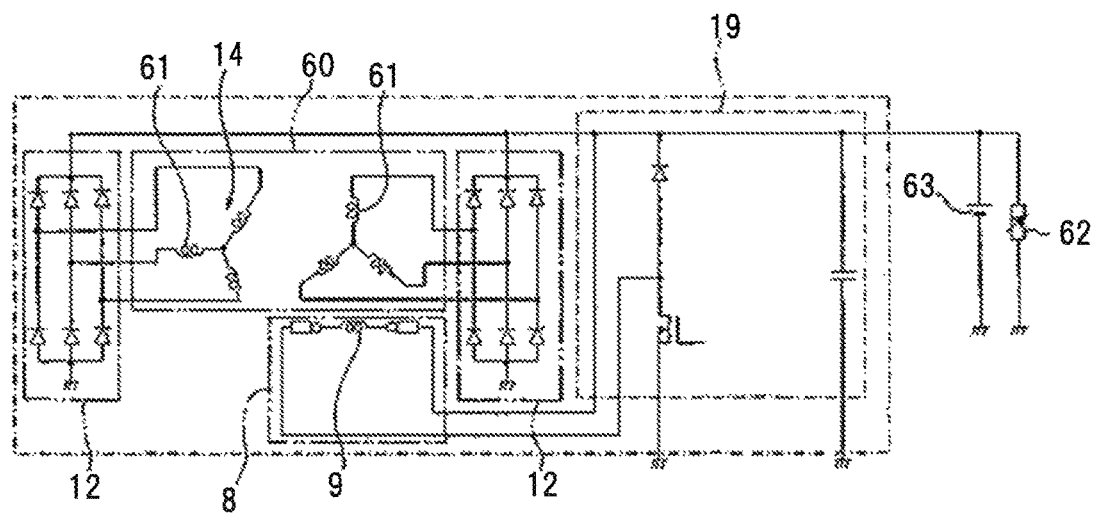
FIG. 2 is a diagram of an electrical circuit of the vehicle-use alternating current generator of FIG. 1.
Figure 3:
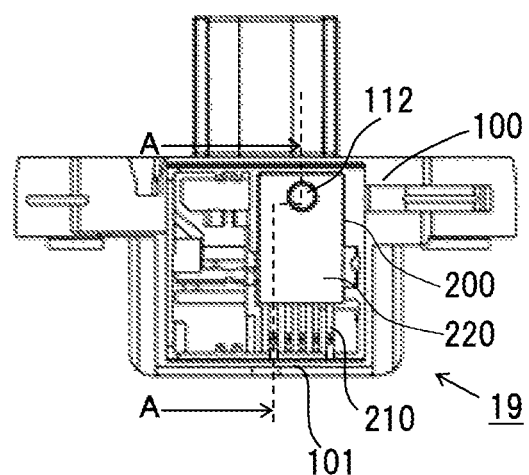
FIG. 3 is a plan view of the regulator according to the first embodiment of the invention.
Figure 4:
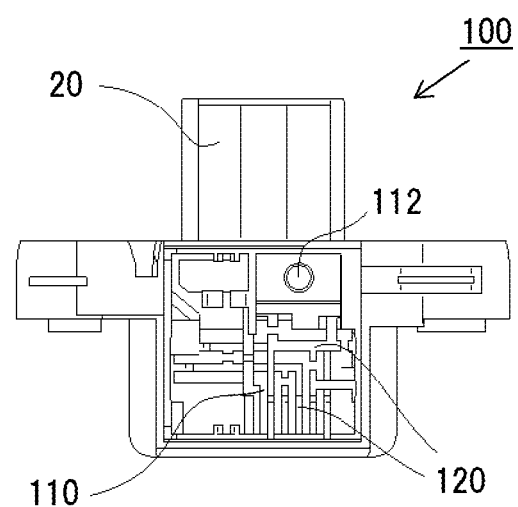
FIG. 4 is a plan view of a regulator holder according to the first embodiment of the invention.
Figure 5A:
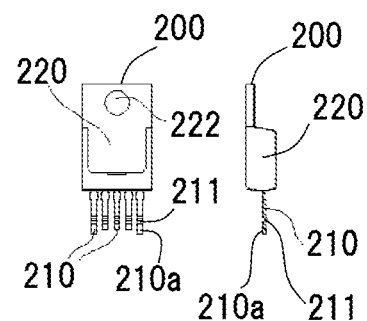
Figure 5B:
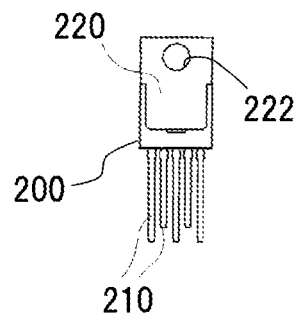

FIG. 1 is a schematic sectional view of a vehicle-use alternating current generator in which is mounted a regulator of a first embodiment of the invention, FIG. 2 is a diagram of an electrical circuit of the vehicle-use alternating current generator of FIG. 1, FIG. 3 is a plan view of a regulator, and FIG. 4 is a plan view of a regulator holder. Also, FIG. 5A is a plan view and side view of a molded package type IC regulator after molding of a lead terminal, and FIG. 5B is a plan view of the IC regulator before molding of the lead terminal.

Firstly, based on FIG. 1, an overall structure of a vehicle-use alternating current generator 1 will be described.

The vehicle-use alternating current generator 1 includes a casing 4 formed of a front bracket 2 and rear bracket 3, a shaft 6 rotatably supported by the casing 4 across a pair of bearings 5, a pulley 7 fixed to an end portion of the shaft 6 protruding on a front side of the casing 4, a rotor 8 fixed to the shaft 6 and disposed inside the casing 4, a fan 11 fixed to either end face in an axial direction of the rotor 8, a stator 12 fixed to the casing 4 so as to enclose the rotor 8, a pair of slip rings 15, fixed to a protruding portion of the shaft 6 protruding on a rear side of the casing 4, that supply current to the rotor 8, a pair of brushes 16 that slide on a surface of each of the slip rings 15, a brush holder 17 that houses the brushes 16, a regulator 19 (voltage regulator), attached to a heatsink 18 disposed on an outer diameter side of the brush holder 17, that regulates a magnitude of alternating current voltage generated in the stator 12, a connector 20, molded integrally with an attachment portion of the heatsink 18, that carries out an input and output of signals between the regulator 19 and the like and an external device (not shown), a rectifying device 21, disposed on a rear side of the rear bracket 3, that rectifies alternating current voltage generated in the stator 12 into direct current voltage, and a protective cover 22 mounted on the rear bracket 3 so as to cover the brush holder 17, regulator 19, and rectifying device 21.

The rotor 8 is a Lundell-type rotor, and includes a field winding 9 through which an exciting current is caused to flow and which generates magnetic flux, and a pole core 10, provided so as to cover the field winding 9, wherein a magnetic pole is formed by magnetic flux of the field winding 9. Also, the stator 12 includes a cylindrical stator iron core 13, and a stator coil 14, mounted on the stator iron core 13, wherein alternating current is generated by a change in magnetic flux from the field winding 9 in accompaniment to a rotation of the rotor 8. The stator 12 is disposed so as to enclose the rotor 8 by the stator iron core 13 being held from both axial direction sides at aperture ends of the front bracket 2 and rear bracket 3.

In FIG. 2, reference sign 60 is a stator configured of the stator iron core 13 and stator coil 14, 61 is a winding portion, and the stator coil 14 is configured of two three-phase alternating current windings wherein three winding portions 61 are in a three-phase Y-connection. Reference sign 62 indicates an electrical load, and 63 indicates a battery.

Also, although omitted from FIG. 2 of the first embodiment, an IC regulator (to be described hereafter) main body configuring the regulator 19 is also electrically connected to an external vehicle-mounted device and the like.

FIG. 3 shows a plan view of the regulator 19 in which an IC regulator 200 after molding of a lead terminal 210 is assembled in a regulator holder 100. In the IC regulator 200, a contact portion 211 for joining to an insert terminal 120 of the regulator holder 100 is formed on a leading end of the lead terminal 210 protruding from an IC chip portion 220 wherein an IC chip is molded from resin, and a lead protruding portion 210a is provided so as to protrude outward from the contact portion 211. The regulator holder 100 has an IC regulator mounting portion 110 on which the IC regulator 200 is mounted, and a frame portion formed to rise up from a mounting face on an edge of the IC regulator mounting portion 110. The frame portion of the regulator holder 100 includes at least a lead opposing portion 101, which is a rising wall face portion opposing the lead terminal 210. The lead protruding portion 210a is fitted into a depressed positioning reception portion 130 wherein one portion of the lead opposing portion 101 of the regulator holder 100 is cut away, whereby the IC regulator 200 is positioned with respect to the regulator holder 100. Also, a depressed portion 222 is formed in the IC chip portion 220 of the IC regulator 200, and a protruding portion 112 that fits into the depressed portion 222 is disposed on an IC package mounting face of the regulator holder 100.

The regulator 19 shown in FIG. 3 can be obtained by the molded package type IC regulator 200 shown in FIG. 5A being mounted in the regulator holder 100 shown in FIG. 4.

As shown in the plan view of the regulator holder 100 in FIG. 4, the IC regulator mounting portion 110 that houses the IC regulator 200 is in a flat portion of the regulator holder 100, and the regulator holder 100 includes the insert terminal 120 integrally molded with the regulator holder 100, and the connector 20, which is to be connected to a vehicle-side connector. By the IC regulator 200 being mounted, the insert terminal 120 is connected to the lead terminal 210 of the IC regulator 200. Also, one end of the insert terminal 120 is exposed inside the IC regulator mounting portion 110, and another end is disposed in a portion connecting with the connector 20 and the rectifying device 21 and rear bracket 3.

As shown in the plan view and side view in FIG. 5A of a rear face side of the IC regulator 200 in which the lead terminal 210 is molded for mounting on the regulator 100, the IC regulator 200 is configured of the lead terminal 210 and the IC chip portion 220 wherein an IC chip is integrally molded. The lead terminal 210 has a protruding contact portion 211 protruding on a rear face side in a vicinity of a leading end portion of the lead terminal 210. To date, a normal form of the lead terminal 210 wherein the contact portion 211 forms a contact with the insert terminal 120 has been that lead terminals 210 are formed in a state extended linearly so as to be of the same length as far as the contact portion 211 that comes into contact with the insert terminal 120 of the regulator holder 100. In the first embodiment, however, two of five lead terminals 210 have the lead protruding portion 210a protruding from the contact portion 211 in order that the two lead terminals 210 are longer than the other lead terminals 210, and there is a characteristic such that the lead protruding portion 210a fits into the lead opposing portion 101 of the regulator holder 100.

Herein, for example, an IC regulator of a type called an industrial standard external package form "TO220" is used as the IC regulator 200. As shown in FIGS. 5A and 5B, for example, the IC regulator 200 shown has five lead terminals 210.

The IC regulator 200 of FIG. 5A is shown in a state wherein the lead terminal 210 is cut to an appropriate length for mounting in the regulator holder 100. As opposed to this, when procuring the general-purpose IC regulator 200 as a part, the lead terminal 210 of the IC regulator 200 is of a greater length than necessary, and no contact portion 211 is formed, as shown in the plan view of FIG. 5B. Further, normally, the IC regulator 200 is mounted in the regulator holder 100 after implementing a process of cutting each lead leading end portion to a desired length on the IC regulator 200 in the state in FIG. 5B when the part is procured, thereby forming the contact portion 211.

When the IC regulator 200 is stored in the IC regulator mounting portion 110 of the regulator holder 100, the contact portion 211 of the lead terminal 210 is eventually joined to the insert terminal 120 exposed inside the IC regulator mounting portion 110.

When storing the IC regulator 200 in the IC regulator mounting portion 110, storing is carried out by the lead protruding portion 210a of the lead terminal 210 being fitted into the lead opposing portion 101 opposing the lead terminal 210 provided on the periphery of the IC regulator mounting portion 110.

Herein, a storage method whereby the protruding portion 112 provided on the flat face of the IC regulator mounting portion 110 of the regulator holder 100 is fitted into the depressed portion 222 included in the IC chip portion 220 of the IC regulator 200 may be used to augment the fitting state of the lead terminal 210 and lead opposing portion 101.

Next, using FIGS. 6A and 6B, FIG. 7, and FIG. 8, a description will be given of a structure of positioning the IC regulator 200 in the regulator holder 100, which is a main portion of the invention.

Figure 6A:
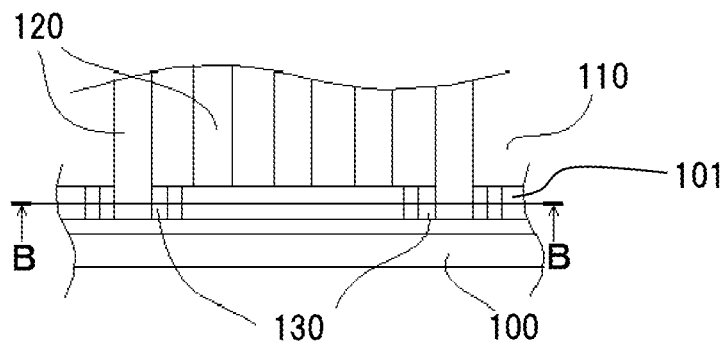
Figure 6B:
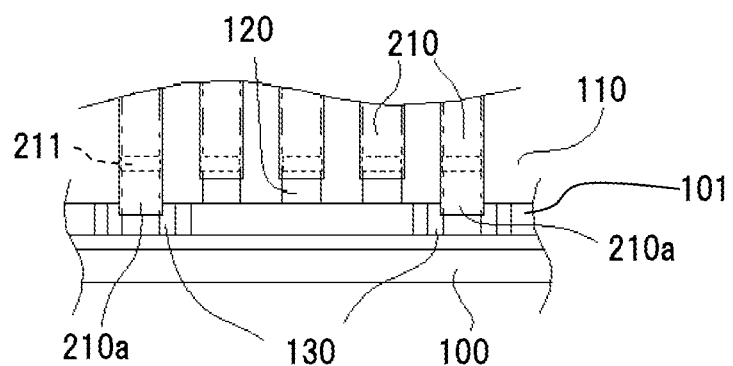

FIGS. 6A and 6B are plan views wherein positioning portions of the IC regulator 200 and regulator holder 100 are enlarged. FIG. 6A shows a main portion of the insert terminal 120 of the IC regulator mounting portion 110, and FIG. 6B, being an enlarged view showing a state wherein the IC regulator 200 is mounted in the IC regulator mounting portion 110 of the regulator holder 100 of FIG. 6A, is an enlarged view showing the lead opposing portion 101 of the regulator holder 100 and a state wherein the IC regulator 200 is mounted.

Figure 7:
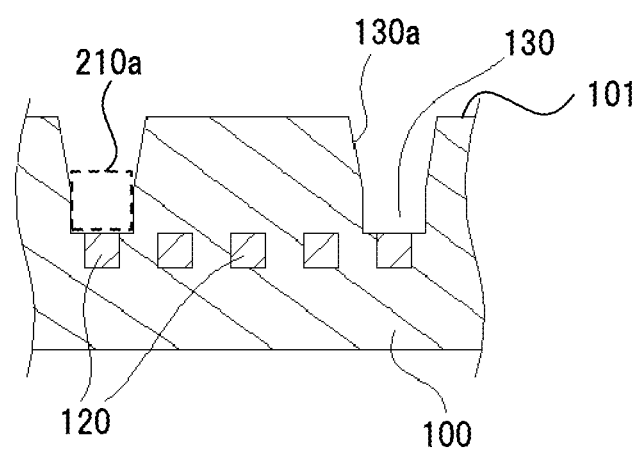
FIG. 7, being a main portion sectional view of the regulator holder configuring the regulator according to the first embodiment of the invention, is a sectional view along a B-B line of FIG. 6A.

FIG. 7, being a B-B sectional view of FIG. 6A, is a diagram showing a sectional form of the positioning reception portion 130, which is a depressed portion provided in the lead opposing portion 101 of the regulator holder 100 that positions the lead protruding portion 210a of the IC lead terminal 210. The positioning reception portion 130 is a groove-form portion formed by cutting away one portion of the lead opposing portion 101, which rises up in a wall form enclosing the IC regulator mounting portion 110. Further, an inclined face portion that forms an insertion guide 130a of the lead terminal 210 is provided on an inner face portion of the depressed portion, which is of a groove form, so that the lead protruding portion 210a is easily inserted into the positioning reception portion 130 when mounting.

Figure 8:
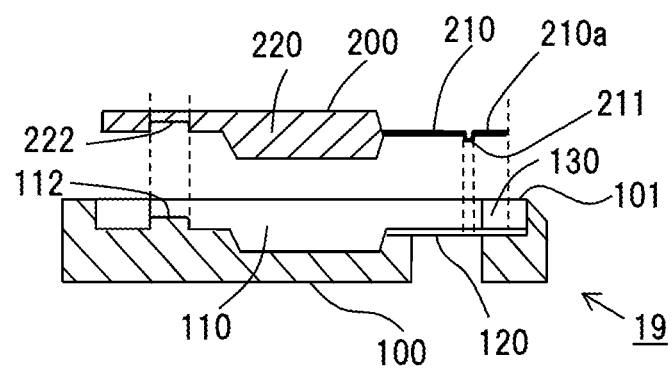
FIG. 8 is an exploded sectional view along an A-A line of FIG. 3 of the regulator according to the first embodiment of the invention.
Figure 9:
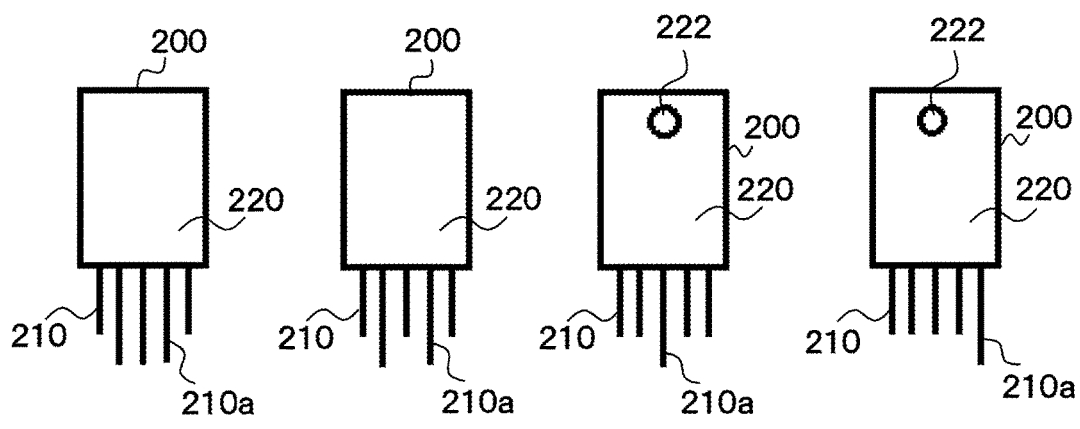
FIGS. 9A, 9B, 9C and 9D are plan views showing a modified example of the IC regulator according to the first embodiment of the invention.

Also, FIG. 8, being an exploded sectional view of the regulator 19 along an A-A line of FIG. 3, shows that the lead protruding portion 210a can be easily fitted into the positioning reception portion 130 of the lead opposing portion 101 when mounting the IC regulator 200 in the IC regulator mounting portion 100, and that the fitting portion can be configured inward of the external form of the regulator holder 100.

The regulator holder 100 of FIG. 7 is such that an example wherein the positioning reception portion 130 is formed in a total of two places at the left and right ends of the five lead terminals 210 corresponding to the insert terminal 120 is shown as one example. Further, the lead protruding portion 210a is fitted into each positioning reception portion 130, whereby positioning is carried out. Also, it goes without saying that an angle of inclination of the insertion guide 130a of the positioning reception portion 130, which forms a guide when assembling the IC regulator 200, can be set arbitrarily.

Also, as shown in the plan view of FIG. 6A and exploded sectional view of FIG. 8, the lead protruding portion 210a, which forms an integrated positioning portion to the leading end side of the contact portion 211 of the lead terminal 210 to be connected to the insert terminal 120, is housed in the depressed portion that forms the positioning reception portion 130. As the IC regulator 200 main body is positioned in, for example, two places, no force fitting function is needed, and the lead terminal 210 is not affected by deformation or the like when housing. Also, as the lead protruding portion 210a has normally been a region that is cut off and disposed of before part assembly, the lead protruding portion 210a can easily be obtained, with no special process change, simply by a specified cutting-off position in a cutting-off process differing, and as is clear from FIG. 5A and FIG. 6B, the lead protruding portion 210a can be configured simply by the lead terminal 210 being molded to be longer than other lead terminals 210.

According to the regulator 19 of the vehicle-use alternating current generator 1 of the first embodiment of the invention, as heretofore described, highly accurate positioning of both the IC regulator 200 and regulator holder 100 can be implemented simply by the lead protruding portion 210a of the lead terminal 210 being housed in the positioning reception portion 130 provided in the lead opposing portion 101 of the regulator holder 100. Consequently, an improvement in assembly reliability and productivity of the IC regulator 200 and regulator holder 100 can be achieved, and changes in design of the IC regulator 200 and regulator holder 100 can be kept to a minimum, whereby implementation can be carried out with no increase in cost.

Positioning of a desired high accuracy can be carried out with no accompanying large change in design of the IC regulator 200 and regulator holder 100, and without increasing the size of the external form of the regulator holder 100, an improvement in the reliability of assembling the IC regulator 200 in the regulator holder 100, and in productivity, can be achieved, and the general-purpose IC regulator 200 can be employed, whereby cost can be kept low.

The heretofore described lead terminal 210 not being limited to the form shown in FIGS. 5A and 5B and FIGS. 6A and 6B, and in the same way, the positioning reception portion 130 not being limited to the form shown in FIGS. 6A and 6B and FIG. 7, the forms may be changed arbitrarily. A modified example of the IC regulator 200 is shown in FIGS. 9A, 9B, 9C and 9D. For example, as shown in FIGS. 9A and 9B, the lead protruding portion 210a can also be provided in places other than the two end portions of a multiple of lead terminals 210 disposed in parallel. As it is sufficient that the number of lead terminals 210 is a number needed to configure the control circuit of the generator, there is no need to form the lead terminal 210 solely to perform a positioning role. Also, there is no need for a width of the lead terminal 210 to be constant. Further, which portion of the lead terminal 210 alignment the lead protruding portion 210a is provided in can be set arbitrarily, as it is not essential that the lead protruding portion 210a is provided in the two end portions of the molded portion. For example, the lead protruding portion 210a may be provided on the three of the five lead terminals 210 other than those in the two end portions, and adopted as a positioning portion, as shown in FIG. 9A, or a structure such that the lead protruding portion 210a is provided on the two of the five lead terminals 210 other than those in the center and in the two end portions may be adopted, as in FIG. 9B.

Also, in the case of a configuration of positioning using the depressed portion 222 provided in the IC chip portion 220 of the IC regulator 200, a desired positioning accuracy can be obtained by providing the lead protruding portion 210a in only any one place among the multiple of lead terminals 210 provided in the IC regulator 200, as shown in FIGS. 9C and 9D. The lead protruding portion 210a can be provided in a central portion among the five lead terminals 210, as in FIG. 9C, or the lead protruding portion 210a may be provided in one end portion of the five lead terminals 210, or the like, as in FIG. 9D. In this way, even when there is only one positioning portion formed by the lead terminal 210, a configuration that relies on fitting the depressed portion 222 of the IC chip portion 220 onto the protruding portion 112 provided on the flat face of the IC regulator mounting portion 110 when storing the IC regulator 200 in the regulator holder 100 is such that the problem of rotational deviation occurring when assembling the IC regulator 200 can be sufficiently resolved.

Second Embodiment

Figure 10:
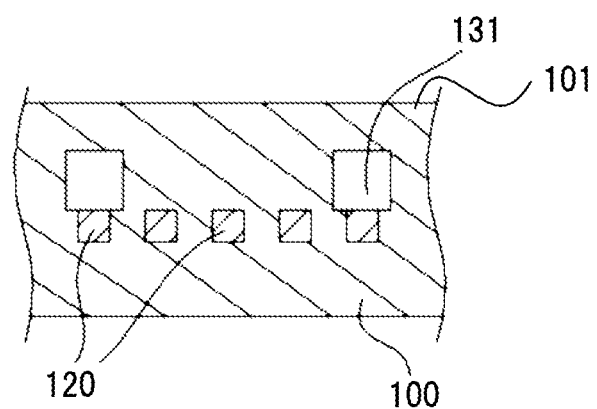
FIG. 10 is a main portion sectional view of a regulator holder configuring a regulator according to a second embodiment of the invention.

In the first embodiment, the positioning reception portion 130 formed in the regulator holder 100 is a depressed portion of a groove form scooped out downward from an upper end of the lead opposing portion 101. In the second embodiment, a description is given of a case in which a hole 131 opened in a lateral direction in an inner wall of the lead opposing portion 101 is provided as a depressed portion of the positioning reception portion 130 other than that heretofore described, as shown in FIG. 10. The hole 131 is a lateral hole opened in a direction in which the lead extends in a portion in which the lead protruding portion 210a interferes when mounting the IC regulator 200 in the regulator holder 100.

A depressed portion that forms the positioning reception portion 130 of the regulator holder 100 can be realized simply by the kind of lateral direction hole 131 shown in the sectional view of FIG. 10 by adapting the method of housing the IC regulator 200 in the IC regulator mounting portion 110, whereby a configuration such that the lead opposing portion 101 is, as far as possible, not removed can be adopted.

Third Embodiment

Figure 11A:
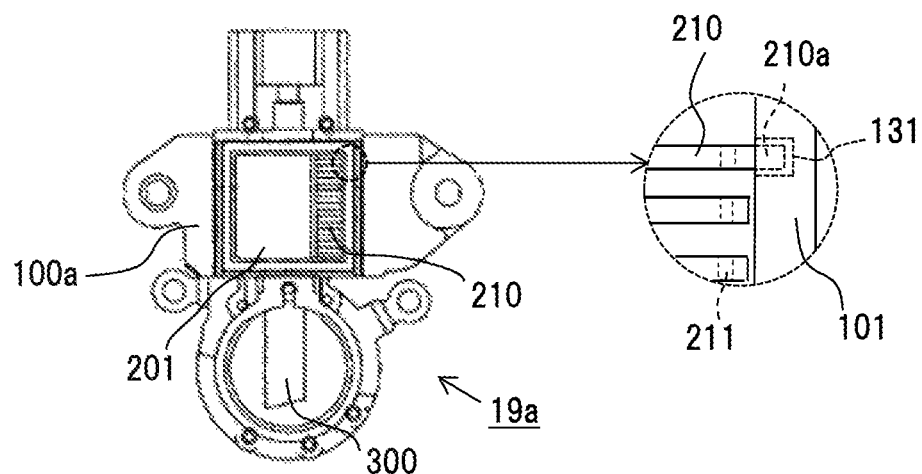
Figure 11B:
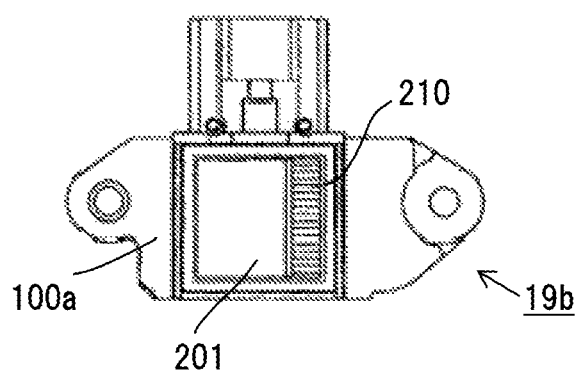

In the first and second embodiments, using the IC regulator 200 having an industrial standard external package form has been given as an example, but in the third embodiment, a description will be given of regulators 19a and 19b in which an IC regulator 201 of an arbitrary form is used, as shown in FIGS. 11A and 11B.

As exemplified in FIGS. 11A and 11B, the invention is applicable to an IC regulator 201 of an external form other than an industrial standard package. For example, an IC regulator 201 that is not of the industrial standard external package form "TO220" can be mounted in a regulator holder 100a including a brush 300, as shown in FIG. 11A. A model shown in the example of FIG. 11A is such that not only is no IC package standard employed, but also there is no hole such that occupies a large area in a molded portion, and no mounting face protruding portion corresponding to a hole is configured.

Also, FIG. 11B is a plan view showing a case in which the IC regulator 201 is mounted in a type of regulator holder 100a that does not include the brush 300.

Even when the IC regulator 201 is mounted in various types of regulator holder 100a in this way, the lead protruding portion 210a can be positioned in the hole 131, as in an example of the fitting state of the lead terminal 210 and lead opposing portion 101 in a partial enlarged view of FIG. 11A.

The embodiments can be freely combined, and each embodiment can be modified or abbreviated as appropriate, without departing from the scope of the invention.

The invention claimed is:

1. A vehicle-use alternating current generator regulator, comprising:
   an IC regulator comprising:
      an IC chip that configures a voltage control circuit of the vehicle-use alternating current generator and is sealed with a sealing resin, and
      a plurality of lead terminals that protrude from the sealing resin and are disposed in parallel to each other; and
   a regulator holder comprising:
      an IC regulator mounting portion in which the IC regulator is mounted; and
      a lead opposing portion that is provided on a periphery of the IC regulator mounting portion and disposed to oppose the plurality of parallel lead terminals, wherein
   at least one lead terminal of the plurality of lead terminals comprises a lead protruding portion that protrudes longer than the rest of the plurality of lead terminals, from a contact portion with the regulator holder, in a direction from the sealing resin to the lead opposing portion, and
   the lead protruding portion is fitted into the lead opposing portion of the regulator holder.

2. The vehicle-use alternating current generator regulator according to claim 1, wherein
   the at least one lead terminal of the plurality of lead terminals to be positioned in the lead opposing portion is formed to be longer than the rest of the plurality of lead terminals by an amount equivalent to the lead protruding portion.

3. The vehicle-use alternating current generator regulator according to claim 1, wherein
   a plurality of the lead protruding portion are provided with respect to one IC regulator.

4. The vehicle-use alternating current generator regulator according to claim 1, wherein
   a depressed portion in which the lead protruding portion of the at least one lead terminal is inserted is provided in the lead opposing portion of the regulator holder.

5. The vehicle-use alternating current generator regulator according to claim 4, wherein
   the depressed portion is formed in a groove formed by one portion of the lead opposing portion being cut away, and an inclined face portion that forms an insertion guide of the at least one lead terminal is provided on an inner face portion of the depressed portion.

6. The vehicle-use alternating current generator regulator according to claim 4, wherein
   the depressed portion is a hole opened in an inner wall of the lead opposing portion.

* * * * *